US008394672B2

(12) United States Patent
Su et al.

(10) Patent No.: US 8,394,672 B2
(45) Date of Patent: Mar. 12, 2013

(54) METHOD OF MANUFACTURING AND ASSEMBLING SEMICONDUCTOR CHIPS WITH OFFSET PADS

(75) Inventors: Michael Z. Su, Round Rock, TX (US); Gamal Refai-Ahmed, Ontario (CA); Bryan Black, Spicewood, TX (US)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 128 days.

(21) Appl. No.: 12/856,632

(22) Filed: Aug. 14, 2010

(65) Prior Publication Data
US 2012/0038061 A1   Feb. 16, 2012

(51) Int. Cl.
*H01L 21/44* (2006.01)
*H01L 21/48* (2006.01)
*H01L 21/50* (2006.01)

(52) U.S. Cl. .................. 438/108; 438/613; 257/E21.705
(58) Field of Classification Search ........... 257/E21.705; 438/108, 613
See application file for complete search history.

(56) References Cited

U.S. PATENT DOCUMENTS

| 6,639,299 B2* | 10/2003 | Aoki ............................ 257/531 |
| 7,198,980 B2 | 4/2007 | Jiang et al. |
| 7,772,104 B2* | 8/2010 | Pham et al. ................... 438/612 |
| 7,977,157 B2* | 7/2011 | Fee et al. ...................... 438/106 |
| 2005/0167798 A1 | 8/2005 | Doan |
| 2009/0289360 A1* | 11/2009 | Takahashi et al. ............ 257/737 |

OTHER PUBLICATIONS

Arthur Keigler et al.; *Copper Deposition for Pillars and Vias*; Semiconductor Manufacturing Magazine; vol. 7, Issue 8; Aug. 2006; pp. 1-6.

* cited by examiner

*Primary Examiner* — Howard Weiss
(74) *Attorney, Agent, or Firm* — Timothy M. Honeycutt

(57) ABSTRACT

A semiconductor chip device includes a first semiconductor chip adapted to be stacked with a second semiconductor chip wherein the second semiconductor chip includes a side and first and second conductor structures projecting from the side. The first semiconductor chip includes a first edge, a first conductor pad, a first conductor pillar positioned on but laterally offset from the first conductor pad toward the first edge and that has a first lateral dimension and is adapted to couple to one of the first and second conductor structures, a second conductor pad positioned nearer the first edge than the first conductor pad, and a second conductor pillar positioned on but laterally offset from the second conductor pad and that has a second lateral dimension larger than the first lateral dimension and is adapted to couple to the other of the first and second conductor structures.

14 Claims, 5 Drawing Sheets

METHOD OF MANUFACTURING AND ASSEMBLING SEMICONDUCTOR CHIPS WITH OFFSET PADS

BACKGROUND OF THE INVENTION

1. Field of the Invention

This invention relates generally to semiconductor processing, and more particularly to stacked semiconductor chip devices and methods of making and assembling the same.

2. Description of the Related Art

A typical conventional flip-chip packaged semiconductor chip consists of a laminate of several layers of different materials. From bottom to top, a typical package consists of a base or carrier substrate, a die underfill material, an array of solder joints and the silicon die. For some designs, a thermal interface material and a lid or heat spreader top off the stack. In some designs the carrier substrate includes a ball grid array to connect to another circuit board. Each of the layers of the package generally has a different coefficient of thermal expansion (CTE). In some cases, the coefficients of thermal expansion for two layers, such as the underfill material and the silicon die, may differ by a factor of ten or more. Materials with differing CTE's strain at different rates during thermal cycling.

Some conventional chip packages incorporate stacked dice. Like a conventional package substrate, a conventional die typically includes plural layers of different materials, such as a bulk semiconductor layer, an active device layer, and multiple metallization layers interspersed with dielectrics. Such metallization may be on the front and backside of the die. Not surprisingly, the layers of the conventional die have different CTE's.

Thus for a conventional stacked dice and carrier substrate arrangement, the multitude of different CTE's will tend to produce differential strain rates that can produce warping of the carrier substrate and the silicon dice. If the warping is severe enough, several undesirable things can occur.

One risk associated with stacked dice warping is solder joint delamination. If the warping is severe enough, some of the solder joints between the stacked dice can delaminate or fracture and cause electrical failure.

Another pitfall associated with die warping is the potential difficulty in establishing metallurgical bonds between interconnects of the mating dice. The warping causes the lower surfaces of interconnect structures of one or both the stacked dice to be non-planar. Depending on the direction of warping, the interconnects at the outer edges of one of the dice may be either higher or lower than those near the interior. If a given interconnect of one die is too far away from a corresponding interconnect on the other die at the time of reflow, the interconnects may not merge to form a solder joint after reflow and leave an open circuit.

The present invention is directed to overcoming or reducing the effects of one or more of the foregoing disadvantages.

SUMMARY OF EMBODIMENTS OF THE INVENTION

In accordance with one aspect of an embodiment of the present invention, a method of assembling a semiconductor chip device is provided that includes stacking a first semiconductor chip with a second semiconductor chip. The first semiconductor chip includes a first edge and the second semiconductor chip includes a side and first and second conductor structures projecting from the side. The first semiconductor chip also includes a first conductor pad and a first conductor pillar positioned on but laterally offset from the first conductor pad toward the first edge. The first conductor pillar has a first lateral dimension and is adapted to couple to one of the first and second conductor structures. The first semiconductor chip also includes a second conductor pad positioned nearer the first edge than the first conductor pad, and a second conductor pillar positioned on but laterally offset from the second conductor pad. The second conductor pad has a second lateral dimension larger than the first lateral dimension and is adapted to couple to the other of the first and second conductor structures.

In accordance with another aspect of an embodiment of the present invention, a method of manufacturing is provided that includes fabricating a first semiconductor chip that is adapted to be stacked with a second semiconductor chip. The first semiconductor chip includes a first edge and the second semiconductor chip includes a side and first and second conductor structures projecting from the side. A first conductor pad is formed on the first semiconductor chip. A first conductor pillar is formed on but laterally offset from the first conductor pad toward the first edge and with a first lateral dimension and is adapted to couple to one of the first and second conductor structures. A second conductor pad is formed on the first semiconductor chip and positioned nearer the first edge than the first conductor pad. A second conductor pillar is formed on but laterally offset from the second conductor pad, has a second lateral dimension larger than the first lateral dimension, and is adapted to couple to the other of the first and second conductor structures.

In accordance with another aspect of an embodiment of the present invention, an apparatus is provided that includes a first semiconductor chip adapted to be stacked with a second semiconductor chip wherein the second semiconductor chip includes a side and first and second conductor structures projecting from the side. The first semiconductor chip includes a first edge, a first conductor pad, a first conductor pillar positioned on but laterally offset from the first conductor pad toward the first edge and that has a first lateral dimension and is adapted to couple to one of the first and second conductor structures, a second conductor pad positioned nearer the first edge than the first conductor pad, and a second conductor pillar positioned on but laterally offset from the second conductor pad and that has a second lateral dimension larger than the first lateral dimension and is adapted to couple to the other of the first and second conductor structures.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate a first semiconductor chip with conductor pillars coupled to conductor pads with pillar-to-pad lateral offset and pillar lateral dimensions that increase with distance toward an edge or corner of the chip. This arrangement can compensate for lateral and vertical displacements of mating interconnect structures of a warped semiconductor chip slated for stacking on the first semiconductor chip. Additional details will now be described.

Figure 1:
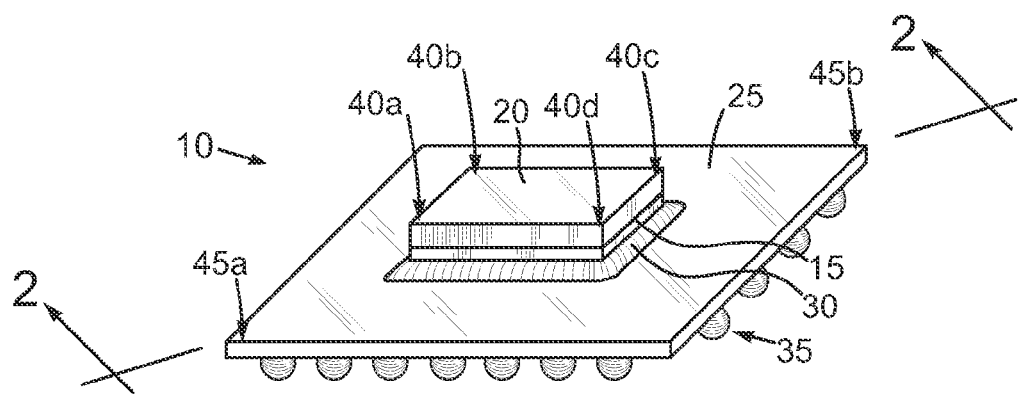
FIG. 1 is a pictorial view of an exemplary embodiment of a semiconductor chip device that includes stacked semiconductor chips positioned on a circuit board.

In the drawings described below, reference numerals are generally repeated where identical elements appear in more than one figure. Turning now to the drawings, and in particular to FIG. 1 is a pictorial view of an exemplary embodiment of a semiconductor chip device 10 that includes stacked semiconductor chips 15 and 20 positioned on a circuit board 25. As described in more detail below, the semiconductor chip 15 may actually be an interposer or an integrated circuit as desired. Furthermore, it should be understood from the outset that more than two semiconductor chips 15 and 20 may be stacked together in various arrangements as desired. The electrical interconnections between the semiconductor chips 15 and 20 will be shown in subsequent figures and described in more detail below. To lessen the unwanted effects of differential CTE, an underfill material layer, a portion of which is visible as the bead 30, may be positioned around and between the semiconductor chip 15 and the circuit board 25. The underfill material 30 may be composed of well-known epoxy materials, such as epoxy resin with or without silica fillers and phenol resins or the like. Two examples are types 8437-2 and 2BD available from Namics.

The semiconductor chips 15 and 20 may be any of a myriad of different types of circuit devices used in electronics, such as, for example, microprocessors, graphics processors, combined microprocessor/graphics processors, application specific integrated circuits, memory devices, active optical devices, such as lasers, or the like, and may be single or multi-core or even stacked laterally with additional dice. Furthermore, one or both of the semiconductor chips 15 and 20 could be configured as an interposer with or without some logic circuits. Thus the term "chip" includes an interposer. The semiconductor chips 15 and 20 may be constructed of bulk semiconductor, such as silicon or germanium, or semiconductor on insulator materials, such as silicon-on-insulator materials.

The circuit board 25 may be a semiconductor chip package substrate, a circuit card, or virtually any other type of printed circuit board. Although a monolithic structure could be used for the circuit board 25, a more typical configuration will utilize a buildup design. In this regard, the circuit board 25 may consist of a central core upon which one or more buildup layers are formed and below which an additional one or more buildup layers are formed. The core itself may consist of a stack of one or more layers. If implemented as a semiconductor chip package substrate, the number of layers in the circuit board 25 can vary from four to sixteen or more, although less than four may be used. So-called "coreless" designs may be used as well. The layers of the circuit board 25 may consist of an insulating material, such as various well-known epoxies, interspersed with metal interconnects. A multi-layer configuration other than buildup could be used. Optionally, the circuit board 25 may be composed of well-known ceramics or other materials suitable for package substrates or other printed circuit boards. The circuit board 25 is provided with a number of conductor traces and vias and other structures (not visible) in order to provide power, ground and signals transfers between the semiconductor chips 15 and 20 and another device, such as another circuit board for example. The circuit board 25 may be electrically connected to another device (not shown) by way of an input/output array such as the ball grid array depicted. The ball grid array includes plural solder balls 35 metallurgically bonded to respective ball pads (not shown). The ball pads (not shown) are interconnected to various conductor pads in the circuit board 25 by way of plural interconnect traces and vias and other structures that are not shown. Optionally, other types of interconnects may be used for the circuit board 25, such as pin grid arrays, land grid arrays or other types of interconnect structures.

Figure 2:
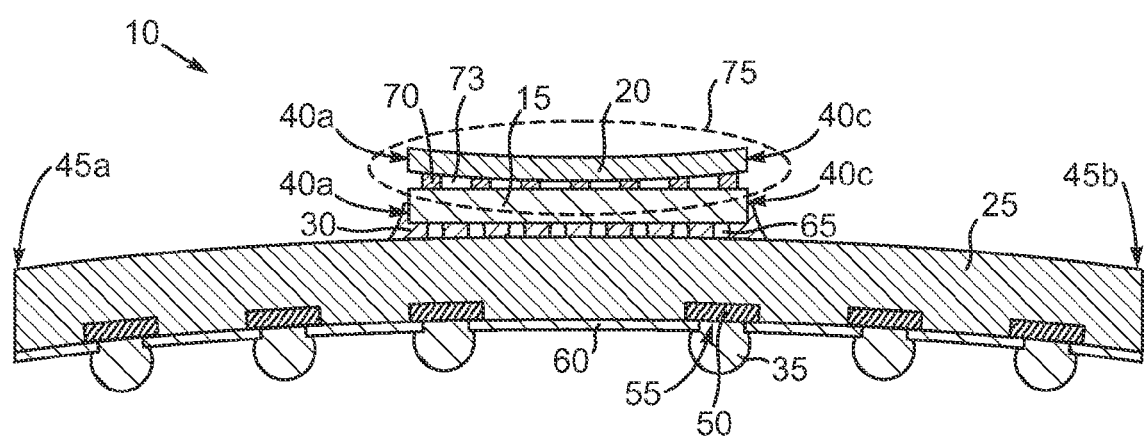
FIG. 2 is a sectional view of FIG. 1 taken at section 2-2.

In this illustrative embodiment, the semiconductor chip 20 has a generally rectangular footprint and thus has four corners 40a, 40b, 40c and 40d. While not apparent from FIG. 1, the semiconductor chip 20 is slightly warped due to variations in CTE among the semiconductor chip 20, the semiconductor chip 15, the underfill material 30 and the circuit board 25. In addition, various forces imposed by interconnect structures between the chips 15 and 20 (not shown) and internal metallization structures (not shown) lead to this warpage. The warpage will be illustrated in greater detail in FIGS. 2, 3 and 4. Before turning to FIG. 2, it is noted that FIG. 2 is a sectional view of FIG. 1 taken at section 2-2 which passes through corners 45a and 45b of the circuit board 25 and corners 40a and 40c of the semiconductor chip 20. With that backdrop, attention is now turned to FIG. 2. Before turning to the structure of the semiconductor chips 15 and 20, additional details of the circuit board 25 will be described. The solder balls 35 may be connected electrically to corresponding ball pads 50. The solder balls 35 project through corresponding openings 55 in a solder mask 60. The solder balls 35 may be composed of lead-free or lead-based solders, such as about 63% Sn and 37% Pb, (about 97.3% Sn 2.7% Ag), (about 99% Sn 1% Cu), or (about 96.5% Sn 3% Ag 0.5% Cu) or the like. The ball pads 50 may be composed of copper, silver, nickel, platinum, gold, aluminum, palladium, alloys or laminates of these or the like. The solder mask 60 may be composed of a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd. Optionally, other materials, such as various epoxies or polymers such as polyimide may be used for the solder mask 60. Of course, if an interconnect structure other than ball grid arrays used such as a land grid array or a pin grid array then there may still be some sort of interface pads but not necessarily a solder mask. The ball pads 50 electrically interface with various vias and metallization layers in the circuit board 25 but are not visible.

The semiconductor chip 15 may be electrically connected to the circuit board 25 by way of plural interconnect structures 65. The interconnect structures 65 may be, for example, solder joints composed of the types of solders described above or the like, conductor pillars composed of copper, silver, nickel, platinum, gold, aluminum, palladium, alloys or laminates of these or the like, or other interconnect structures as desired.

While the underfill material 30 only extends up to an intermediate portion of the semiconductor chip 15, it should be understood that the underfill 30 could be dispensed in such a way that portions of the semiconductor chip 20 are contacted thereby as well.

In this illustrative embodiment, the semiconductor chip 20 may be electrically interconnected with the semiconductor chip 15 by way of plural interconnect structures 70 that are interspersed in a gap 73 between the semiconductor chips 15 and 20. The scale of FIG. 2 is such that the details of the interconnect structure 70 are not readily apparent. However, subsequent figures will reveal additional details of the interconnect structure 70 and others like it. The gap 73 may be left empty or filled with an insulating material, such as an underfill or other type of polymer.

The warpage of the semiconductor chip 20 and the circuit board 25 are due largely to differences in CTE among the semiconductor chips 15 and 20, the circuit board 25, the interconnect structures 65 and 70. These effects are influenced by the number, thickness, composition and arrangement of various other metallization layers and vias that populate the semiconductor chips 15 and 20 and the circuit board 25. In this illustrative embodiment, the semiconductor chip device 10 is depicted with a warpage state of the semiconductor chip 20 and the circuit board 25 that exists at roughly room temperature. Thus, the semiconductor chip 20 has a generally upward warpage and the circuit board 25 has a generally downward warpage. However, at elevated temperatures such as those encountered during a solder reflow, compression bonding or other process, the warpage of the semiconductor chip 20 and the circuit board 25 may be in the opposite directions to that depicted in FIG. 2. Note the location of the dashed oval 75. The portion of FIG. 2 circumscribed by the dashed oval 75 will be shown at greater magnification in FIG. 3.

Figure 3:
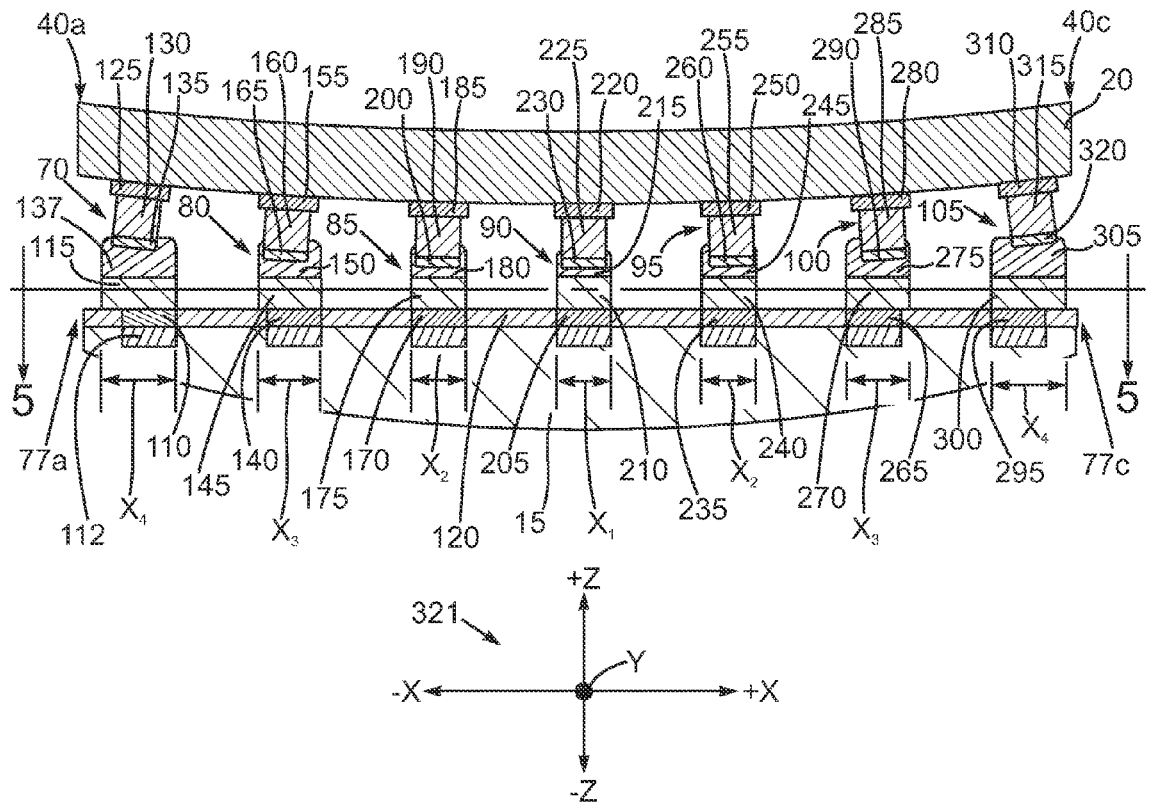
FIG. 3 is a portion of FIG. 2 shown at greater magnification.

Attention is now turned to FIG. 3. As just noted, FIG. 3 depicts the portion of FIG. 2 circumscribed by the dashed oval 75 at greater magnification. Thus, the semiconductor chip 20 and a portion of the semiconductor chip 15, including corners 77a and 77b thereof are visible. In addition, the interconnect structure 70 and other interconnect structures 80, 85, 90, 95, 100 and 105 are visible. The interconnect structure 70 consists of an electrical joint between respective conductor structures of the semiconductor chip 15 and a semiconductor chip 20. In this regard, the semiconductor chip 15 may be provided with a conductor pad 110 that is formed on one of a plurality of conductive vias 112. The vias 112 are, in-turn, electrically connected to other metallization structures (not shown) within the semiconductor chip 15 and may constitute part of the top-most metallization layer of the semiconductor chip 15. The conductor pad 110 may be surrounded laterally by an insulating or passivation film 120, which may be a monolithic layer of insulating material or a laminate of materials. Examples include polyimide, silicon dioxide, silicon nitride or the like. A conductor pad 115 is formed on the conductor pad 110 and provided with both a larger lateral dimension than and a lateral offset relative to the conductor pad 110 to help accommodate for the warpage of the semiconductor chip 20. The selection of the lateral dimension and the amount of offset will be described in more detail below. The portion of the interconnect structure 70 associated with the semiconductor chip 20 may consist of a conductor pad 125 that is electrically connected to other metallization lines and vias and other structures (not shown) within the semiconductor chip 20 and a conductor pad or pillar that is coupled to the conductor pad 125. Note that due to the upward warpage of the corner 40a of the semiconductor chip 20, there is a gap between the conductor pad 115 and the conductor pad 130. This gap may be addressed by providing the conductor structure 130 with a solder cap 135 and the conductor structure 115 with a mating solder cap 137. It should be understood that if the anticipated room temperature warpage state of the semiconductor chip 20 is such that the conductor structures 115 and 130 will establish reliable ohmic contact and perhaps be subject to thermal bonding or other joining processes, then one or both of the solder caps 135 and 137 may be eliminated.

The interconnect structure 80 may similarly consist of a conductor pad 140, a conductor pad 145 and solder cap 150 of the semiconductor chip 15 and a mating conductor pad 155, a conductor pad 160 and a solder cap 165 of the semiconductor chip 20. The interconnect structure 85 may consist of a conductor pad 170, a conductor pad 175 and a solder cap 180 of the semiconductor chip 15 and a conductor pad 185, a conductor pad 190 and a solder cap 200 of the semiconductor chip 20. The interconnect structure 90 may consist of a conductor pad 205, a conductor pad 210 and a solder cap 215 of the semiconductor chip 15 and a conductor pad 220, a conductor pad 225 and a solder cap 230 of the semiconductor chip 20. The interconnect structure 95 may consist of a conductor pad 235, a conductor pad 240 and a solder cap 245 of the semiconductor chip 15 and a conductor pad 250, a conductor pad 255 and a solder cap 260 of the semiconductor chip 20. The interconnect structure 100 may consist of a conductor pad 265, a conductor pad 270 and a solder cap 275 of the semiconductor chip 15 and a conductor pad 280, a conductor pad 285 and a solder cap 290 of the semiconductor chip 20. Finally, the interconnect structure 105 may consist of a conductor pad 295, a conductor pad 300 and a solder cap 305 of the semiconductor chip 15 and a conductor pad 310, a conductor pad 315 and a solder cap 320 of the semiconductor chip 20. Of course the skilled artisan will appreciate that the number of interconnect structures 70, 75, 80, 85, 90, 95, 100 and 105 may be subject to great variety and number into the hundreds or thousands depending upon the complexity of the semiconductor chips 15 and 20.

To describe additional details of the sizes and spatial relationships of some of the components of the interconnect structures 70, 75, 80, 85, 90, 95, 100 and 105, it will be useful to introduce a three-dimensional coordinate system 321 consisting of X, Y and Z axes, where the Y-axis is coming out of the page. The interconnect structure 90 may be approximately located at the center or null point of the semiconductor chip 20, where the null point is coincident with the Z-axis. At the null point, the warpage of the semiconductor chip 20 does not produce much if any rotation of the conductor pillar 225 relative to the conductor pad 210. The conductor pillar 210 may have a lateral dimension $X_1$ and be substantially vertically aligned with the underlying conductor pad 205 as shown. However, proceeding from the interconnect structure 95 toward the corner 40a of the semiconductor chip 20, the interconnect structures 85, 80 and 70 may be provided with varying sizes and spatial orientations in order to compensate for the unwanted rotation of the conductor pillars 190, 160 and 130 relative to the corresponding conductor pillars 175, 145 and 115, respectively. Thus, the conductor pillar 175, located near the null point where warpage is less severe, may have a lateral dimension $X_2$ that is larger than the lateral dimension of the conductor pad 170 and may or may not be vertically aligned with the conductor pad 170. Similarly, the conductor pillar 145, located further from the null point where warpage effects are increasing, may have a lateral dimension $X_3$ that is larger still than the lateral dimension $X_2$ and be offset laterally in the −X-direction relative to the underlying conductor pad 200. Finally, the conductor pillar 115, located proximate the corners 40a and 77a where warpage effects are greatest, may have a lateral dimension $X_4$ which is larger still than the lateral dimension $X_3$ and be offset laterally in the −X-direction relative to the underlying conductor pad 210. The combination of the increasing lateral dimensions $X_2$, $X_3$, and $X_4$ and lateral offsets of the conductor pillars 175, 145 and 115 provides several important functions. To begin with, the increasing lateral dimension $X_2$, $X_3$, and $X_4$ in the −X-direction provides larger surface areas to receive successively greater volume solder caps 180, 150 and 137. The larger volume solder caps 180, 150 and 137 facilitate the metallurgical wetting and bonding to the corresponding solder caps 200, 165 and 135, particularly where the conductor pillars 190, 160 and 130 are not only rotated relative to the mating portions conductor pillars 175, 145 and 115, but also vertically separated therefrom in the +Z-direction due to the warping at the corner 40a. The successively greater lateral offsets of the conductor pillars 145 and 115 relative to the underlying conductor pads 140 and 110, respectively, further facilitate the bonding of the solder caps 165 and 150 and the solder caps 135 and 137. The same structural features may be applied to the interconnect structures 95, 100 and 105 in the +X-direction. Here, the interconnect structures 95, 100 and 105 may be configured as essentially a mirror image of the interconnect structures 85, 80 and 70 where the conductor pillar 240 may have the lateral dimension $X_2$, the conductor pillar 270 may have the lateral dimension $X_3$ and an offset in the +X-direction relative to the conductor pad 265, and the conductor pillar 295 may have the lateral dimension $X_4$ and a lateral offset in the +X-direction relative to the conductor pad 300. This staggering of pillar lateral dimensions and offsets may be provided in any direction in the X-Y plane.

For a given semiconductor chip 20, the warpage pattern will be generally known or easily obtained by modeling and experimentation. Accordingly, those areas in need of tailored conductor pillar lateral dimension and pillar-to-pad offset will be known. For example, composite CTE's for the semiconductor chips 15 and 20 may be calculated or experimentally determined. With those values, the dimensions of the semiconductor chips 15 and 20 and the conductor pillars and pad of interest in hand, the X and Y coordinates of the conductor pad 125 and the conductor pad 110 at a given temperature may be determined. With that knowledge in hand, an appropriate lateral dimension and offset relative to the conductor pad 110 for the conductor pillar 115 may be determined to accommodate for the rotation of the conductor pillar 130 around the Y-axis and displacement in the +Z-direction, and select appropriate volumes for the solder caps 135 and 137 if needed. It may be that one lateral side or just some few portions of the semiconductor chip 20 exhibit warpage. In those instances, conductor pillar lateral dimension and pillar-to-pad offset may be tailored to address the particular warping pattern.

Figure 4:
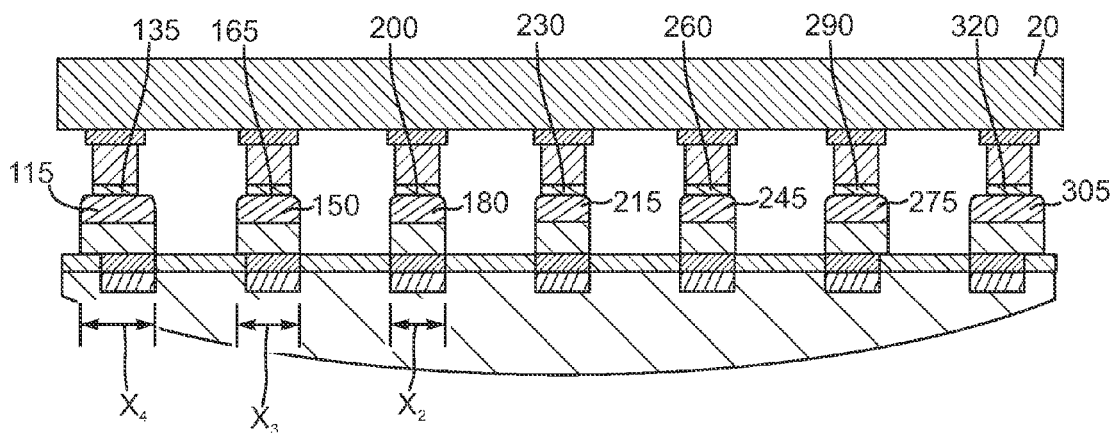
FIG. 4 is a sectional view like FIG. 3, depicting the semiconductor chip device during a heat process.

As noted above, FIG. 3 depicts the semiconductor chip 15 and the semiconductor chip 20 following a reflow to establish the solder bonds for the interconnect structures 70, 80, 85, 90, 95, 100 and 105 and after ramp down to roughly room temperature. This warped state may be contrasted with the elevated temperature state of the semiconductor chips 15 and 20 depicted in FIG. 4. FIG. 4 depicts semiconductor chips 15 and 20 at the point of heating but just prior to full melting of the various solder portions 115, 135, 150, 165, 180, 200, 215, 230, 245, 260, 275, 290, 305 and 320 of the interconnect structures 70, 80, 85, 90, 95, 100 and 105. Note that at this elevated temperature, the magnitude of which will depend upon the compositions of the various solder structures, the semiconductor chip 15 and the semiconductor chip 20 are relatively planar. However, as the semiconductor chips 15 and 20 are ramped back down in temperature, they, and in particular the semiconductor chip 20, begin to exhibit the upward warpage depicted in FIG. 3. With the aforementioned successively increasing conductor pillar dimension $X_2$, $X_3$, $X_4$, etc. and pillar-to-pad offset with increasing distance from the null point, metallurgical bonds will be established despite the warpage.

Figure 5:
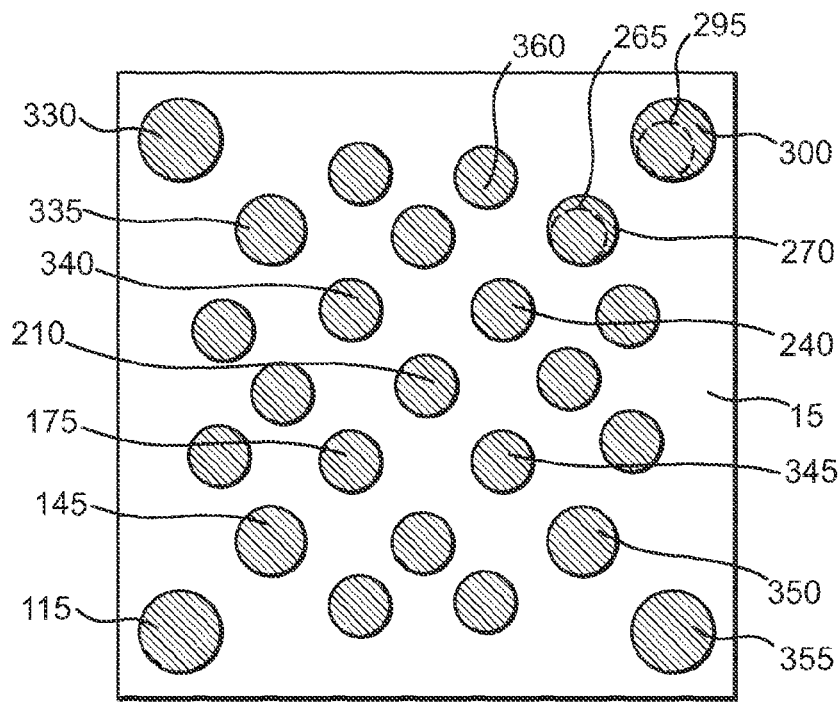
FIG. 5 is a sectional view of FIG. 3 taken at section 5-5.

FIGS. 3 and 4 depict only a few of the interconnect structures 70, 80, 85, 90, 95, 100 and 105. It should be understood that both the number and spatial arrangement of the interconnect structures 70, 80, 85, 90, 95, 100 and 105 may be subject to great variation. In this regard, attention is now turned to FIG. 5, which is a sectional view of FIG. 3 taken at section 5-5. FIG. 5 depicts not only the conductor pillars 115, 145, 175, 210, 240, 270 and 300 visible in FIG. 3, but also additional and similarly functioned conductor pillars 330, 335, 340, 345, 350, 355 and others. Here, the group of conductor pillars 330, 335 and 340 and the group of conductor pillars 345, 350 and 355 may be staggered on either side of the conductor pillar 210 and configured with the successive increases in both lateral dimension and pillar-to-pad offset with increasing distance from the null point as described generally above with regard to the pillars conductor pillars 115, 145, 175, 210, 240, 270 and 300. Note for example, the lateral offsets of the conductor pillars 270 and 300 relative to their corresponding and underlying conductor pads 265 and 295 shown in dashed. In addition, other conductor pillars, such as the conductor pillar 260, may be grouped as part of an interconnect structure of the type depicted in FIGS. 3 and 4 and arranged spatially on the semiconductor chip 15.

Figure 6:
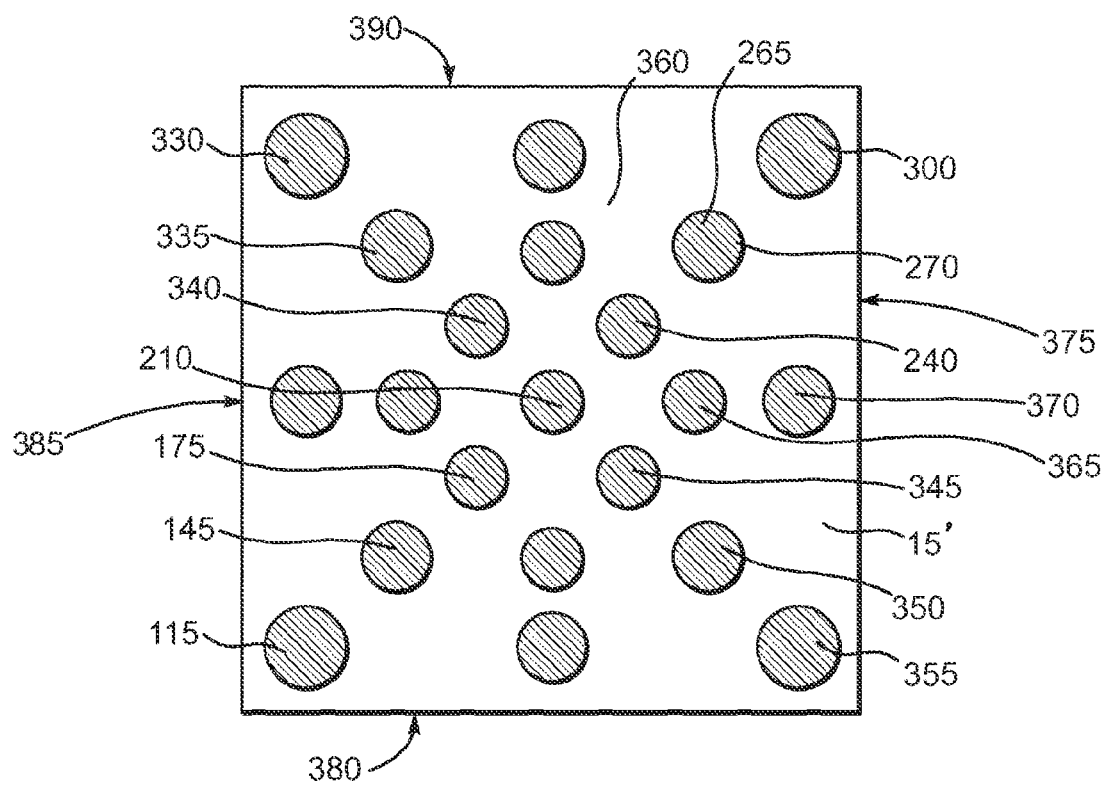
FIG. 6 is a sectional view like FIG. 5, but of an alternate exemplary embodiment a semiconductor chip suitable for die stacking.

Considerable flexibility is envisioned regarding the spatial arrangement of the conductor pillars of a semiconductor chip. FIG. 6 is a sectional view like FIG. 5 but of an alternate exemplary embodiment of a semiconductor chip 15'. Here, the semiconductor chip 15' may be provided with the conductor pillars 115, 145, 175, 210, 240, 270, 300, 330, 335, 340, 345, 350 and 355 as just described. However, in this illustrative embodiment the provision of increasing lateral conductor pillar dimension and pillar-to-pad offset is not limited to progressions towards the corners of the semiconductor chip 15'. Rather, and as illustrated for the conductor pillars 365 and 370, increasing lateral pillar dimension and vertical pillar-to-pad offset may be used extending from the null point out to one or all of the edges 375, 380, 385 and 390 of the semiconductor chip 15', and in this illustration, towards the edge 280. Note that the same can be carried out with regard to progressions toward the other edges 285, 290 and 295.

Figure 7:
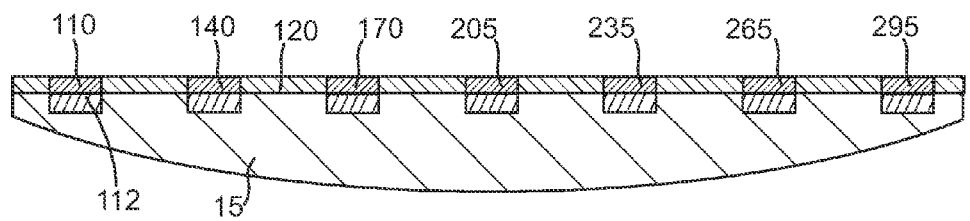
FIG. 7 is a sectional view of a portion of an exemplary semiconductor chip following exemplary conductor pad formation.

An exemplary method of fabricating the conductor pillars 115, 145, 175, 210, 240, 270, 300 depicted in FIGS. 3 and 4 for the semiconductor chip 15 may be understood by referring now to FIGS. 7, 8, 9, 10 and 11 and initially to FIG. 7. The described method will be exemplary of the other pillars of the chip 15 and the chip 15' described herein. FIG. 7 depicts the same general portion of the semiconductor chip 15 shown in FIG. 3. At this stage, the conductor pads 110, 140, 170, 205, 235, 265 and 295 may be formed on the vias 112 using well-known material deposition and patterning techniques. For example, the conductor pads 110, 140, 170, 205, 235, 265 and 295 may be formed using well-known plating, chemical vapor deposition, physical vapor deposition or the like. In this illustrative embodiment, the blanket deposition or plating of a conductor material followed by lithographic patterning, masking and chemical etching. Optionally, the insulating layer 120 may be first formed and thereafter patterned with plural openings to facilitate the subsequent deposition or plating of the conductor pads 110, 140, 170, 205, 235, 265 and 295. The vias 112 may formed using well-known plating, chemical vapor deposition, physical vapor deposition, printing or the like. Exemplary materials for the vias 112 and the conductor pads 110, 140, 170, 205, 235, 265 and 295 include solders of the type described above or the like, conductive pillars composed of copper, silver, nickel, platinum, gold, aluminum, palladium, alloys or laminates of these or the like. Note that the conductor pads 110, 140, 170, 205, 235, 265 and 295 may all have the same general lateral dimension as desired.

Figure 8:
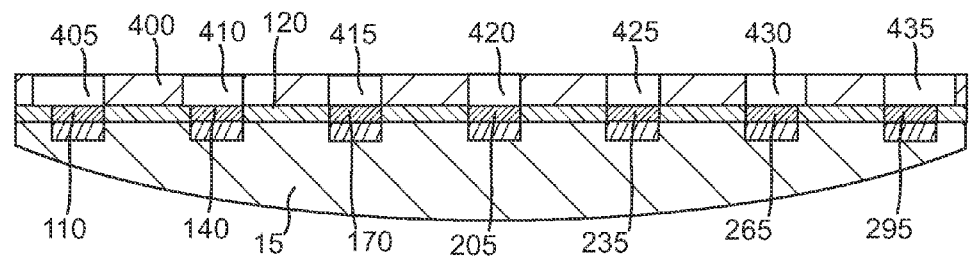
FIG. 8 is a sectional view like FIG. 7 depicting masking of the semiconductor chip.

Referring now to FIG. 8, a suitable mask 400 may be applied to the semiconductor chip 15. The mask 400 may have plural openings 405, 410, 415, 420, 425, 430 and 435 that have both lateral dimensions and vertical placement relative to the underlying conductor pads 110, 140, 170, 205, 235, 265 and 295 that are designed to facilitate the subsequent fabrication of the conductor pillars with the desired lateral dimensions and pillar to pad offsets. In an exemplary embodiment, the mask 400 may be composed of well known photoresist materials and pattern using well known photolithography techniques. However, a hard mask or even a non-contact mask might be used.

Figure 9:
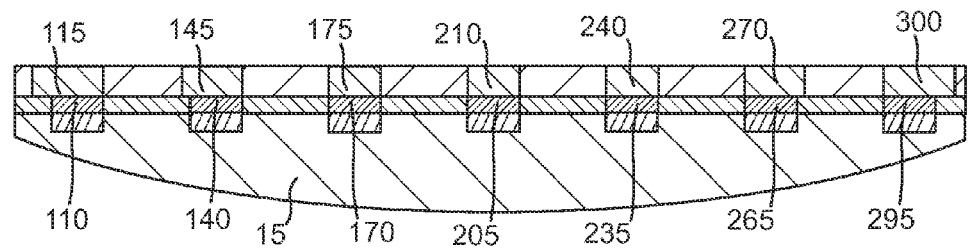
FIG. 9 is a sectional view like FIG. 8 depicting exemplary conductor pillar formation.
Figure 10:
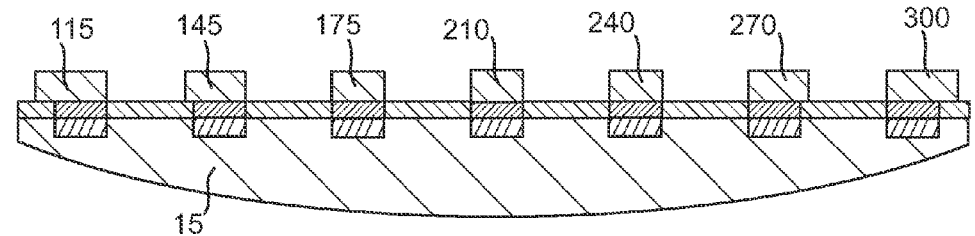
FIG. 10 is a sectional view like FIG. 9 depicting mask removal.
Figure 11:
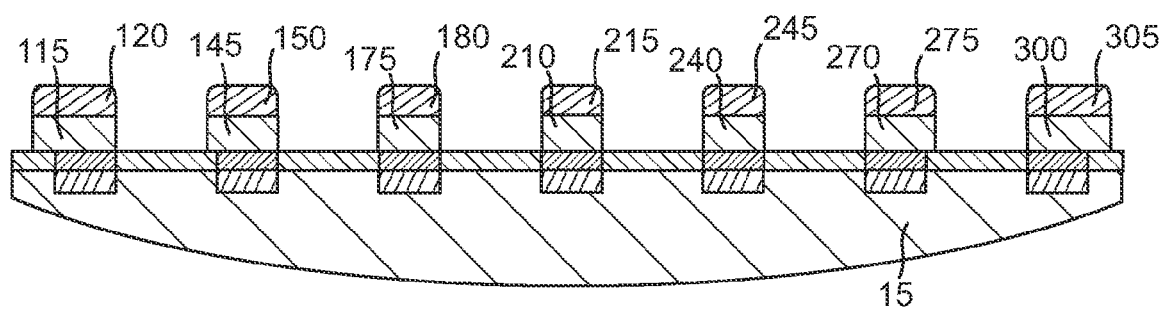
FIG. 11 is sectional view like FIG. 10 depicting exemplary solder cap placement on the conductor pillars.

Referring now to FIG. 9, the conductor pillars 115, 145, 175, 210, 240, 270 and 300 may be formed by depositing material into the openings 405, 410, 415, 420, 425, 430 and 435. Here, a variety of techniques may be used. In an exemplary embodiment, a two-step plating process may be used. In a first process, an electroless process may be used to establish a conductor seed layer of copper or other suitable materials followed by a bulk biased plating process to establish the conductor pillars 115, 145, 175, 210, 240, 270 and 300. With the pillars 115, 145, 175, 210, 240, 270 and 300 formed, the mask 400 may be removed as shown in FIG. 10 by solvent stripping, ashing or other suitable mask removal techniques. At this stage, the semiconductor chip 15 and in particular the conductor pillars 115, 145, 175, 210, 240, 270 and 300 are ready to receive solder caps. Referring now to FIG. 11, the solder caps 137, 150, 180, 215, 245, 275 and 305 may be applied to the conductor pillars 115, 145, 175, 210, 240, 270 and 300 using a variety of techniques, such as, stencil printing, pick and place, jet printing or other solder deposition techniques.

The various conductor structures of the semiconductor chip 20 may be fabricated using some well-known techniques and follow the same process flow just described for the semiconductor chip 15. Indeed, the same types of materials and techniques may be used.

Following the attachment of the solder caps shown in FIG. 11, the semiconductor chip 15 may be brought into close proximity with the semiconductor chip 20 as shown in FIG. 4 and a reflow process may be performed to establish the requisite solder bonding. Thereafter, and during temperature ramp down, the aforementioned interconnect structures 70, 80, 85, 90, 95, 100 and 105 (see FIG. 3) should retain metallurgical bonding despite the warping of a semiconductor chip 20 as room temperature is approached. The semiconductor chips 15 and 20 may be mounted to the circuit board 25 shown in FIGS. 1 and 2. They may be mounted as a stack or one at a time. The fill material layer 73 (see FIG. 2) may be placed between the chips 15 and 20 by capillary fill or other techniques before or after mounting to the circuit board 25. It should be understood that the processing of the semiconductor chips 15 and 20 to form interconnect structures could be performed on die or wafer level.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of assembling a semiconductor chip device, comprising:
   stacking a first semiconductor chip with a second semiconductor chip, the first semiconductor chip including a first edge, the second semiconductor chip including a side and first and second conductor structures projecting from the side; and
   wherein the first semiconductor chip includes a first conductor pad, a first conductor pillar positioned on but laterally offset from the first conductor pad toward the first edge and having a first lateral dimension and being adapted to couple to one of the first and second conductor structures, a second conductor pad positioned nearer the first edge than the first conductor pad, and a second conductor pillar positioned on but laterally offset from the second conductor pad and having a second lateral dimension larger than the first lateral dimension and being adapted to couple to the other of the first and second conductor structures.

2. The method of claim 1, wherein the first semiconductor chip comprises an interposer.

3. The method of claim 1, wherein each of the first and second conductor pillars comprises an end and a solder structure positioned on the end.

4. The method of claim 1, wherein the first conductor structure is coupled to the first conductor pillar and the second conductor structure is coupled to the second conductor pillar.

5. The method of claim 4, wherein the first and second conductor structures comprise conductor pillars.

6. The method of claim 5, wherein each of the first and second conductor structures comprises an end and a solder structure positioned on the end.

7. The method of claim 1, comprising coupling the first and second semiconductor chips to a circuit board.

8. A method of manufacturing, comprising:
   fabricating a first semiconductor chip adapted to be stacked with a second semiconductor chip, the first semiconductor chip including a first edge, the second semiconductor chip including a side and first and second conductor structures projecting from the side; and
   forming a first conductor pad on the first semiconductor chip;
   forming a first conductor pillar on but laterally offset from the first conductor pad toward the first edge and with a first lateral dimension and being adapted to couple to one of the first and second conductor structures;
   forming a second conductor pad on the first semiconductor chip positioned nearer the first edge than the first conductor pad; and
   forming a second conductor pillar on but laterally offset from the second conductor pad and having a second lateral dimension larger than the first lateral dimension and being adapted to couple to the other of the first and second conductor structures.

9. The method of claim 8, wherein the first semiconductor chip comprises an interposer.

10. The method of claim 8, wherein each of the first and second conductor pillars comprises an end, the method comprising placing a solder structure on each of the ends.

11. The method of claim 8, comprising coupling the first conductor structure to the first conductor pillar and the second conductor structure to the second conductor pillar.

12. The method of claim 11, wherein the first and second conductor structures comprise conductor pillars.

13. The method of claim 12, wherein each of the first and second conductor structures comprises an end, the method comprising placing a solder structure on each of the ends.

14. A method of assembling a semiconductor chip device, comprising:

stacking a first semiconductor chip with a second semiconductor chip, the first semiconductor chip including a first edge, the second semiconductor chip including a side and first and second conductor structures projecting from the side; and wherein the first semiconductor chip includes a first conductor pad, a first conductor pillar positioned on but laterally offset from the first conductor pad toward the first edge and having a first lateral dimension and being adapted to couple to one of the first and second conductor structures, a second conductor pad positioned nearer the first edge than the first conductor pad, and a second conductor pillar positioned on but laterally offset from the second conductor pad toward the first edge and having a second lateral dimension larger than the first lateral dimension and being adapted to couple to the other of the first and second conductor structures.

* * * * *